(12) United States Patent
Yamamoto et al.

(10) Patent No.: US 12,199,194 B2
(45) Date of Patent: Jan. 14, 2025

(54) WIRING BASE, PACKAGE FOR STORING SEMICONDUCTOR ELEMENT, AND SEMICONDUCTOR DEVICE

(71) Applicant: KYOCERA Corporation, Kyoto (JP)

(72) Inventors: Makoto Yamamoto, Kirishima (JP); Junichi Minagoe, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 314 days.

(21) Appl. No.: 17/780,681

(22) PCT Filed: Nov. 27, 2020

(86) PCT No.: PCT/JP2020/044276
§ 371 (c)(1),
(2) Date: May 27, 2022

(87) PCT Pub. No.: WO2021/107114
PCT Pub. Date: Jun. 3, 2021

(65) Prior Publication Data
US 2023/0009571 A1    Jan. 12, 2023

(30) Foreign Application Priority Data

Nov. 28, 2019   (JP) ................................ 2019-215439

(51) Int. Cl.
*H01L 31/02* (2006.01)
*H01L 31/0203* (2014.01)
(Continued)

(52) U.S. Cl.
CPC .... *H01L 31/02005* (2013.01); *H01L 31/0203* (2013.01); *H01S 5/02315* (2021.01); *H01S 5/0237* (2021.01); *H01L 24/32* (2013.01); *H01L 24/48* (2013.01); *H01L 24/73* (2013.01); *H01L 2224/32245* (2013.01);
(Continued)

(58) Field of Classification Search
CPC ... H01L 24/32; H01L 24/48; H01L 23/49861; H01L 23/49805; H01L 23/49582; H01L 24/73; H01L 31/02005; H01L 31/0203; H01S 5/02315; H01S 5/0237
See application file for complete search history.

(56) References Cited

U.S. PATENT DOCUMENTS

2005/0236638 A1* 10/2005 Tsukagoshi ........... H01L 33/647
                                                             257/434
2008/0087992 A1*  4/2008 Shi ......................... H01L 24/40
                                                             257/E23.044
2018/0166369 A1*  6/2018 Cook .................. H01L 23/3142

FOREIGN PATENT DOCUMENTS

JP          07-049732 Y2     11/1995
WO     WO-2018003332 A1 *   1/2016   ............. H01L 23/02

* cited by examiner

*Primary Examiner* — Brook Kebede
(74) *Attorney, Agent, or Firm* — Volpe Koenig

(57) ABSTRACT

A wiring base includes a base having a first surface, at least one metal layer positioned on the first surface, at least one lead terminal positioned on the metal layer, and a joining member that is positioned on the metal layer and joins the lead terminal to the metal layer. The lead terminal has a first portion to be in contact with the joining member and also has a second portion being continuous with the first portion. In a cross section of the lead terminal orthogonal to a longitudinal direction of the lead terminal, the first portion has two concave surfaces that are formed near the metal layer so as to be disposed opposite to each other across a center in a transverse direction of the lead terminal.

8 Claims, 15 Drawing Sheets

(51) Int. Cl.
*H01S 5/02315* (2021.01)
*H01S 5/0237* (2021.01)
*H01L 23/00* (2006.01)
(52) U.S. Cl.
CPC ............... *H01L 2224/48225* (2013.01); *H01L 2224/73265* (2013.01); *H01L 2924/12042* (2013.01); *H01L 2924/12043* (2013.01)

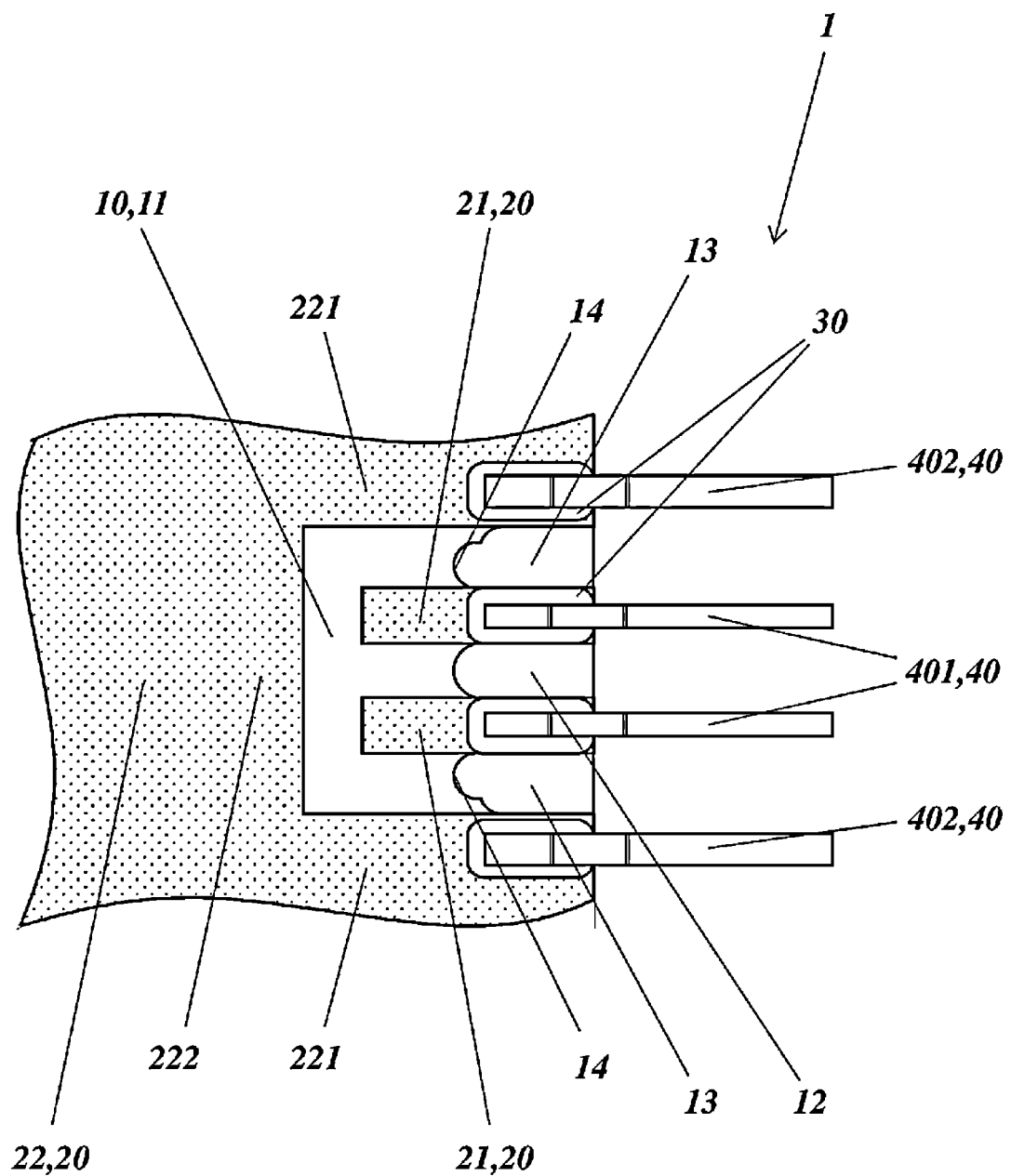

FIG. 13
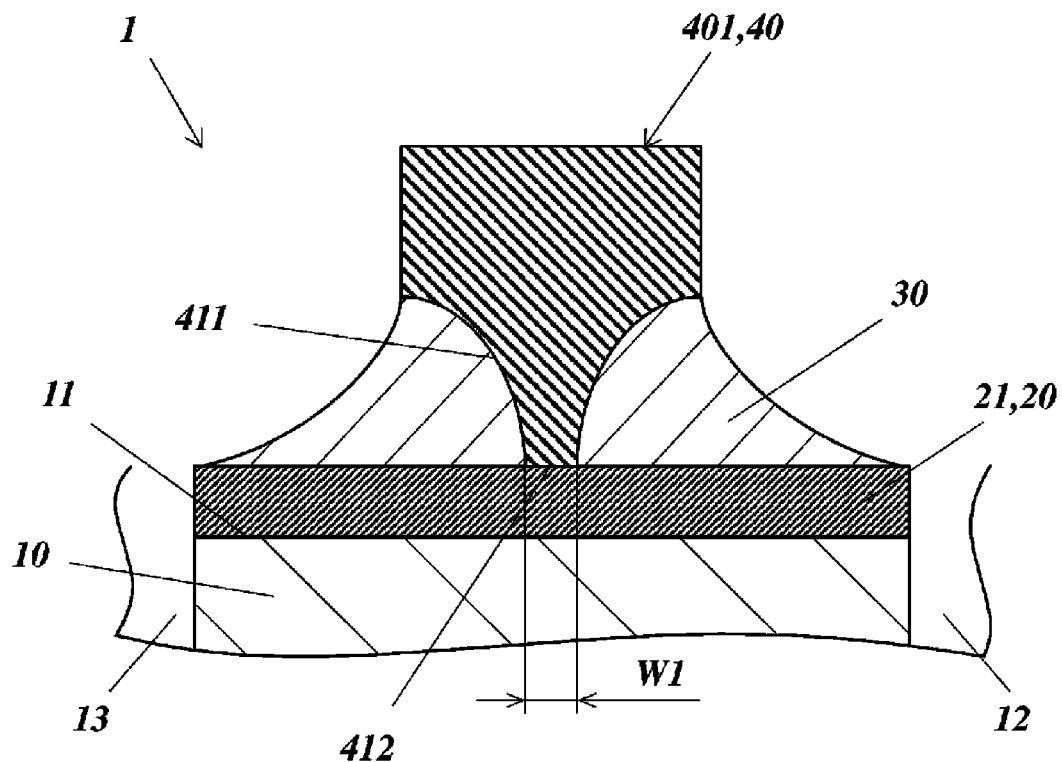
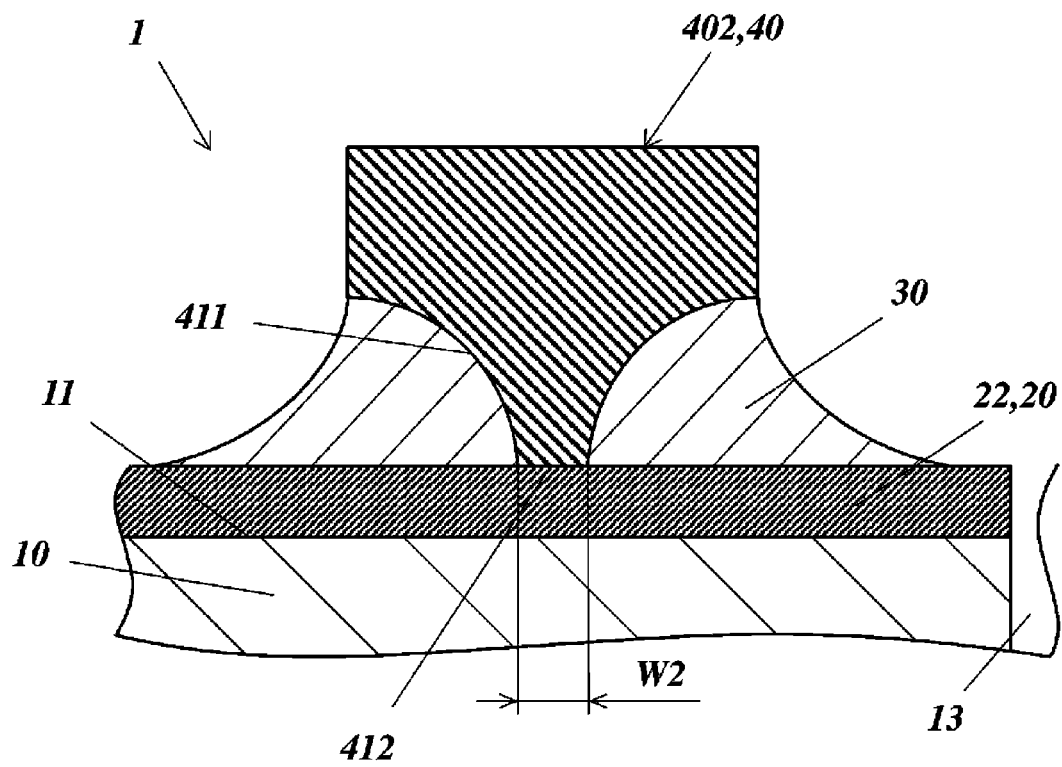

WIRING BASE, PACKAGE FOR STORING SEMICONDUCTOR ELEMENT, AND SEMICONDUCTOR DEVICE

TECHNICAL FIELD

The present disclosure relates to a wiring base, a package for storing semiconductor element, and a semiconductor device.

BACKGROUND ART

A known wiring base used to transmit a high-frequency signal in the millimeter wave band includes signal conductors, grounding conductors, and lead terminals, and joining members join the lead terminals to the signal conductors or the grounding conductors that are formed on the wiring base. Japanese Examined Utility Model Registration Application Publication No. HEI 7-49732 discloses a lead terminal having inclined side surfaces. The lead terminal reduces the likelihood of a joining member spreading when the lead terminal is joined to a signal conductor or a grounding conductor and the joining member is pressed by the lead terminal.

SUMMARY OF INVENTION

According to an embodiment of the present disclosure, a wiring base includes a base having a first surface, at least one metal layer positioned on the first surface, at least one lead terminal positioned on the metal layer, and a joining member that is positioned on the metal layer and joins the lead terminal to the metal layer. The lead terminal has a first portion to be in contact with the joining member and also has a second portion being continuous with the first portion. In a cross section of the lead terminal orthogonal to a longitudinal direction of the lead terminal, the first portion has two concave surfaces that are formed near the metal layer so as to be disposed opposite to each other across a center line that passes through a center of the lead terminal.

According to an embodiment of the present disclosure, a package for storing semiconductor element includes the above-described wiring base, a base plate having a mounting surface, and a frame positioned so as to surround the mounting surface. The frame has an engagement portion formed through the frame in a direction parallel to the mounting surface so as to connect an inside and an outside of the frame. The wiring base is disposed so as to engage the engagement portion.

According to an embodiment of the present disclosure, a semiconductor device includes the above-described package for storing semiconductor element and a semiconductor element positioned at the mounting surface and electrically connected to the signal conductor and the grounding conductor.

BRIEF DESCRIPTION OF DRAWINGS

FIG. 5 is a top view of the wiring base of FIG. 4.

FIG. 13 includes cross-sectional views illustrating part of a wiring base according to an embodiment of the present disclosure.

DESCRIPTION OF EMBODIMENTS

Figure 1:
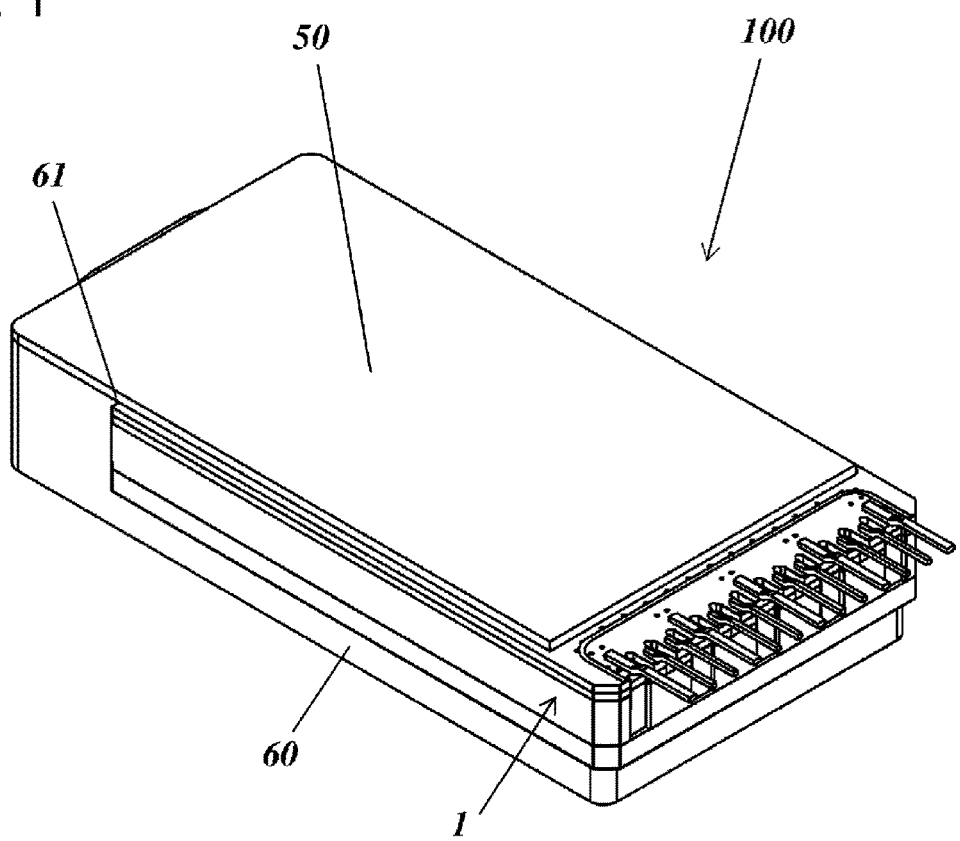
FIG. 1 is a top perspective view illustrating a package for storing semiconductor element according to an embodiment of the present disclosure.
Figure 2:
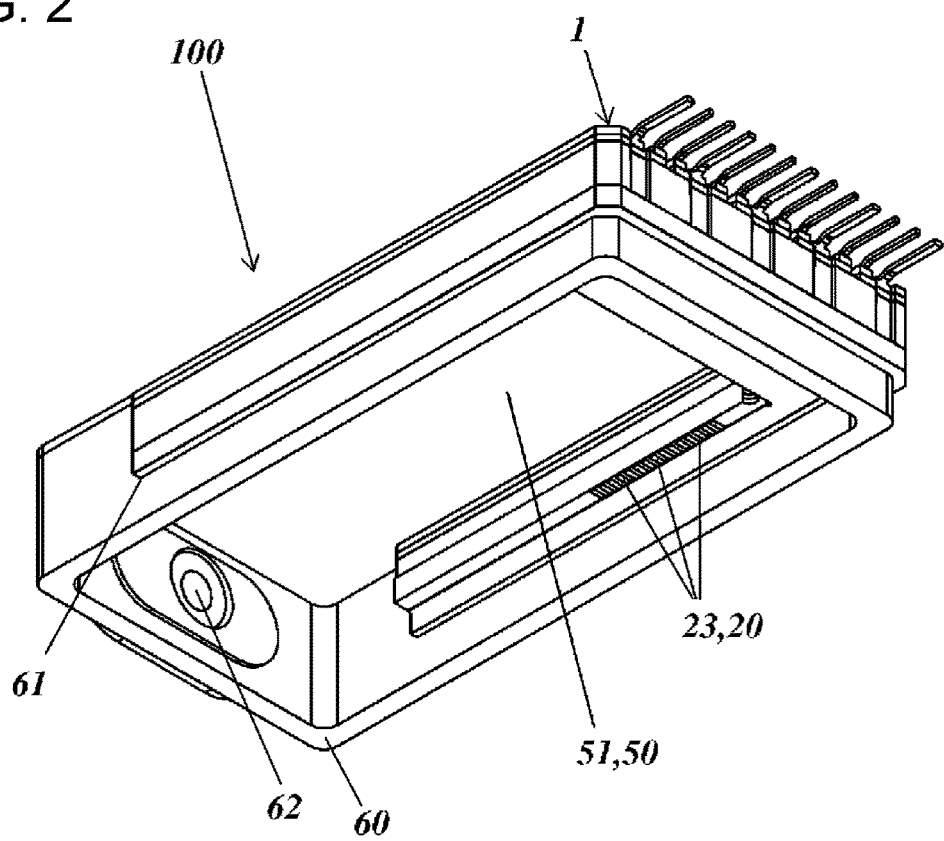
FIG. 2 is a bottom perspective view illustrating the package for storing semiconductor element of FIG. 1.
Figure 3:
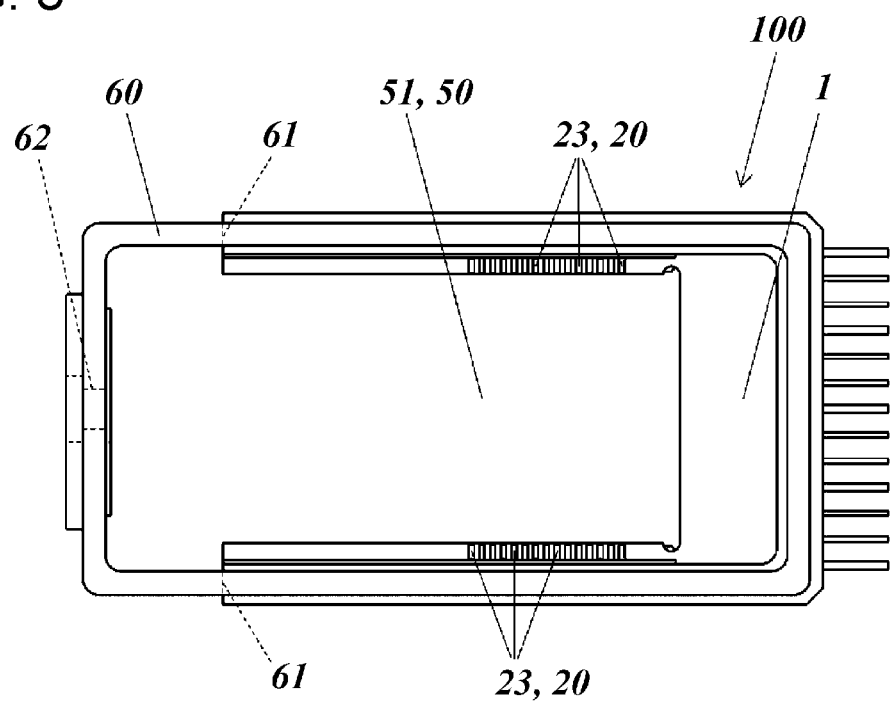
FIG. 3 is a bottom view illustrating the package for storing semiconductor element of FIG. 1.
Figure 4:
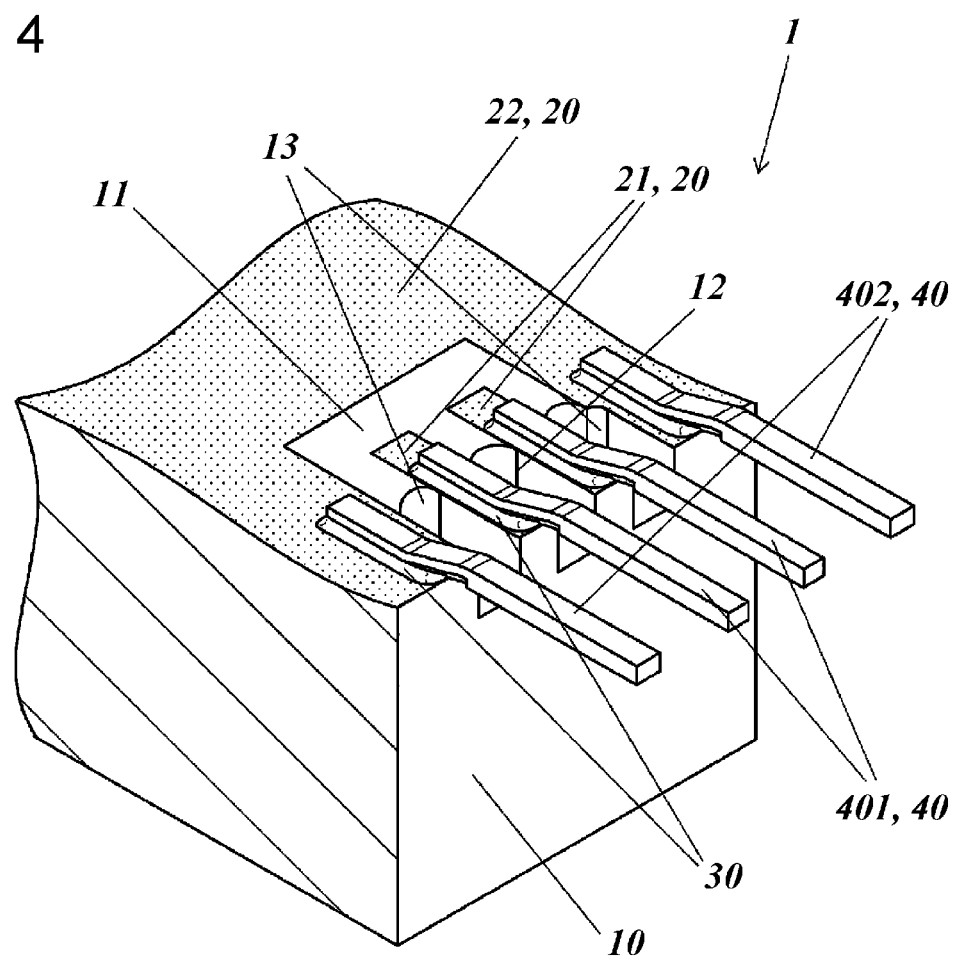
FIG. 4 is a top perspective view illustrating part of a wiring base according to an embodiment of the present disclosure.
Figure 7:
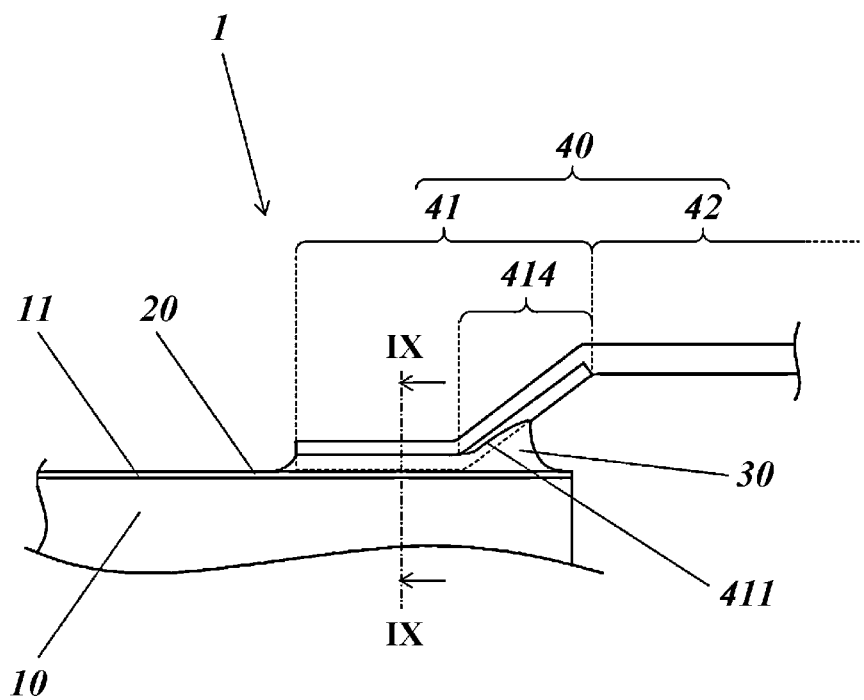
FIG. 7 is a side view illustrating part of a wiring base according to an embodiment of the present disclosure.
Figure 8:
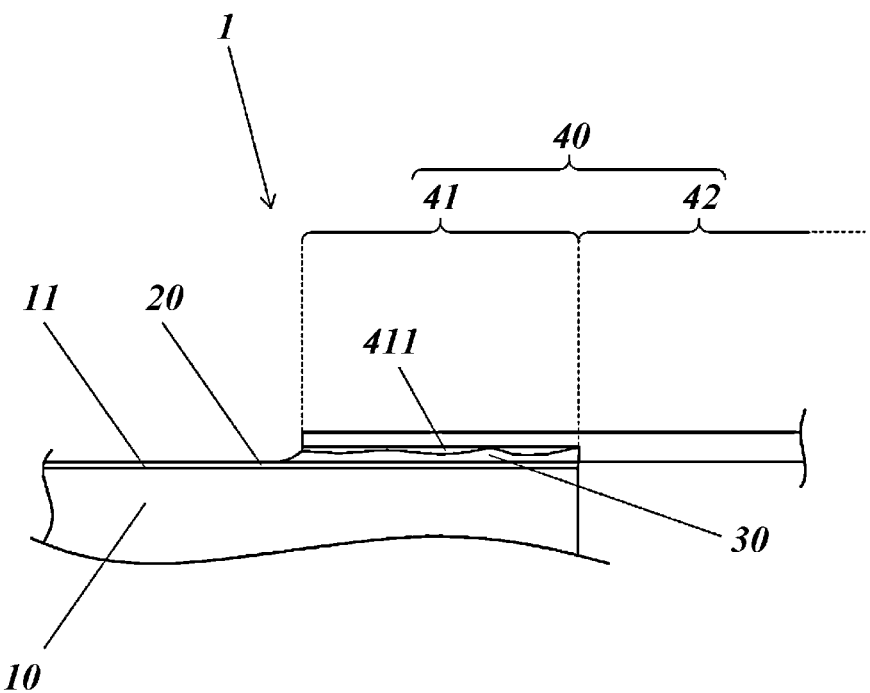
FIG. 8 is a side view illustrating part of a wiring base according to an embodiment of the present disclosure.

The following describes a wiring base 1, a package 100 for storing semiconductor element, and a semiconductor device 1000 according to embodiments of the present disclosure with reference to the drawings. Note that the top surface of the wiring base 1 is referred to as a first surface 11 in the present specification. The bottom surface of the wiring base 1 is the surface opposite to the first surface 11. The up-down direction may be described accordingly. The up-down direction, however, does not necessarily correspond to those of the wiring base 1, the package 100 for storing semiconductor element, and the semiconductor device 1000 when they are in use. FIG. 1 is a perspective view of the package 100 for storing semiconductor element according to an embodiment of the present disclosure. FIG. 1 is a top perspective view when the first surface 11 of the wiring base 1 is viewed. FIG. 2 is a bottom perspective view illustrating the package 100 for storing semiconductor element of FIG. 1. FIG. 3 is a bottom view illustrating the package 100 for storing semiconductor element of FIG. 1. FIG. 4 is a top perspective view illustrating part of the wiring base 1 according to an embodiment of the present disclosure. FIG. 5 is a top view of the wiring base 1 of FIG. 4. FIGS. 7 and 8 are side views illustrating part of the wiring base 1 according to an embodiment of the present disclosure. Note that metal layers 20 are shaded with dots in the perspective view of FIG. 4 and in the plane view of FIG. 5 so that a base 10, the metal layers 20, and joining members 30, and lead terminals 40 are visually distinguishable.

Structure of Wiring Base 1

As illustrated in FIGS. 4, 5, 7, and 8, the wiring base 1 includes the base 10, the metal layers 20, the joining members 30, and the lead terminals 40.

The base 10 may be made of a dielectric material. The dielectric material may be a ceramic material, such as an aluminum oxide-based sintered body, a mullite-based sintered body, a silicon carbide-based sintered body, an aluminum nitride-based sintered body, or a silicon nitride-based sintered body, or may be a glass-ceramic material.

The base 10 may be formed of layers of the dielectric material. Note that layers of the dielectric material that forms the base 10 may be referred to as insulating layers in the present specification. The base 10 has the first surface 11. When the first surface 11 is viewed in plane, the base 10 may be shaped, for example, like a rectangle or the letter U, and the size of the base 10 may be in the range of 2 mm by 2 mm to 25 mm by 50 mm. The height may be in the range of 1 mm to 10 mm. The size of the base 10 and of the first surface 11 can be set appropriately.

At least one metal layer 20 is positioned on the first surface 11. The metal layer 20 may be either a signal conductor 21 or a grounding conductor 22. If multiple metal layers 20 are positioned on the first surface 11, metal layers 20 may be signal conductors 21, and other metal layers 20 may be grounding conductors 22.

When the first surface 11 is viewed in plane, the signal conductor 21 extends from a position inside the first surface 11 toward the outside of the base 10. Note that the extending direction of the signal conductor 21 is defined as the first direction in the present specification.

The signal conductor 21 of the present disclosure is a transmission line for a high-frequency signal (for example, 10 to 100 GHz). A lead terminal 40 coupled to the signal conductor 21 is a first lead terminal 401, which functions as a signal terminal. For example, the signal conductor 21 is shaped like a rectangle. The width of the signal conductor 21, which intersects the first direction, may be in the range of 0.05 mm to 2 mm, and the length in the first direction may be in the range of 0.5 mm to 20 mm. The thickness may be in the range of 0.01 mm to 0.1 mm. Note that the shape of the signal conductor 21 is not limited to the rectangle. The width, length, and thickness of the signal conductor 21 can be set appropriately.

The grounding conductor 22 that is coupled to a ground potential may be positioned on the first surface 11. The grounding conductor 22 may have a first region 221 that is a region extending along the signal conductor 21. A lead terminal 40 coupled to the grounding conductor 22 is a second lead terminal 402, which functions as a grounding terminal. The first region 221 may have a width of 0.05 mm to 3 mm, a length of 0.5 mm to 20 mm, and a thickness of 0.01 mm to 0.1 mm. Note that the shape of the first region 221 of the grounding conductor 22 is not limited to the rectangle. The width, length, and thickness of the first region 221 can be set appropriately.

When the width of the signal conductor 21 is set to be smaller than the width of the grounding conductor 22, the gap between the signal conductor 21 and the grounding conductor 22 can increase, which lowers the effective dielectric constant.

A plurality of the signal conductors 21 and a plurality of the grounding conductors 22 may be provided. The signal conductors and the grounding conductors 22 may be disposed in an alternating manner or may be disposed in a differential-mode arrangement. More specifically, in the differential-mode arrangement, conductors are arranged, as viewed in plane, in order of a grounding conductor 22, a signal conductor 21, a signal conductor 21, and a grounding conductor 22. The wiring base 1 in which the signal conductors 21 and the grounding conductors 22 are disposed in the differential-mode arrangement provides higher resistance against noises. The grounding conductor 22 may have a second region 222 that is continuous with the first regions 221 extending along the signal conductors 21. The second region 222 is disposed such that the second region 222 and the first regions 221 surround the signal conductors 21. The wiring base 1 having the second region 222 provides a wider region for grounding and thereby improves the high-frequency characteristics. The signal conductors 21 and the grounding conductor 22 may be a metallized layer formed on the first surface 11. The metallized layer is made of a metal, such as tungsten, molybdenum, and manganese, and may be plated with nickel or gold.

The lead terminals 40 may be joined to the signal conductors 21 or to the grounding conductor 22 using joining members 30. The joining members 30 are made of solder or of a brazing metal for which an Ag—Cu alloy or an Au—Sn alloy may be used.

As illustrated in FIGS. 4 and 5, a recess 12 may be positioned between adjacent signal conductors 21, or a recess 13 may be positioned between a signal conductor 21 and a grounding conductor 22. The spaces formed by the recesses 12 and 13 are filled, for example, with air having a smaller relative dielectric constant than that of the dielectric material of the base 10. This lowers the effective dielectric constant around the signal conductor 21 and thereby makes it easier to achieve impedance matching. Accordingly, the wiring base 1 configured to have the recesses 12 and 13 improves the frequency characteristics of high-frequency signals.

The cross-sectional shapes of the recesses 12 and 13, which are taken in a direction orthogonal to the first direction, are not specifically limited but may be such that the inside walls of each recess may be tapered or may be inversely tapered to widen the space. When the recesses 12 and 13 have the tapered shapes or the inversely tapered shapes, the effective dielectric constant around the wiring conductors (the signal conductor 21 and the grounding conductor 22) further decreases, which makes it easier to achieve impedance matching. Accordingly, the wiring base 1 configured as above improves the frequency characteristics of high-frequency signals.

When the first surface 11 is viewed in plane, the recesses 12 and 13 may have rectangular shapes. Alternatively, the recesses 12 and 13 may have semicircular or semi-elliptic shapes. When the recesses 12 and 13 have semicircular or semi-elliptic shapes, stresses do not concentrate easily at end portions of the recesses 12 and 13, which reduces the likelihood of cracks occurring at the end portions. In addition, when the first surface 11 is viewed in plane, a hollow 14 may be formed at each end of the recesses 12 and 13 as illustrated in FIG. 5. The recesses 12 and 13 having respective hollows 14 further lowers the effective dielectric constant around the signal conductor 21, which makes it easier to achieve impedance matching. Accordingly, the wiring base 1 configured as above improves the frequency characteristics of high-frequency signals.

The hollow 14 may have a rectangular shape when the first surface 11 is viewed in plane. Alternatively, the hollow 14 may have a semicircular or semi-elliptic shape. The wiring base 1 having the semicircular or semi-elliptic hollows 14 reduces the likelihood of cracks occurring at the end portions of the hollows 14.

Figure 9A:
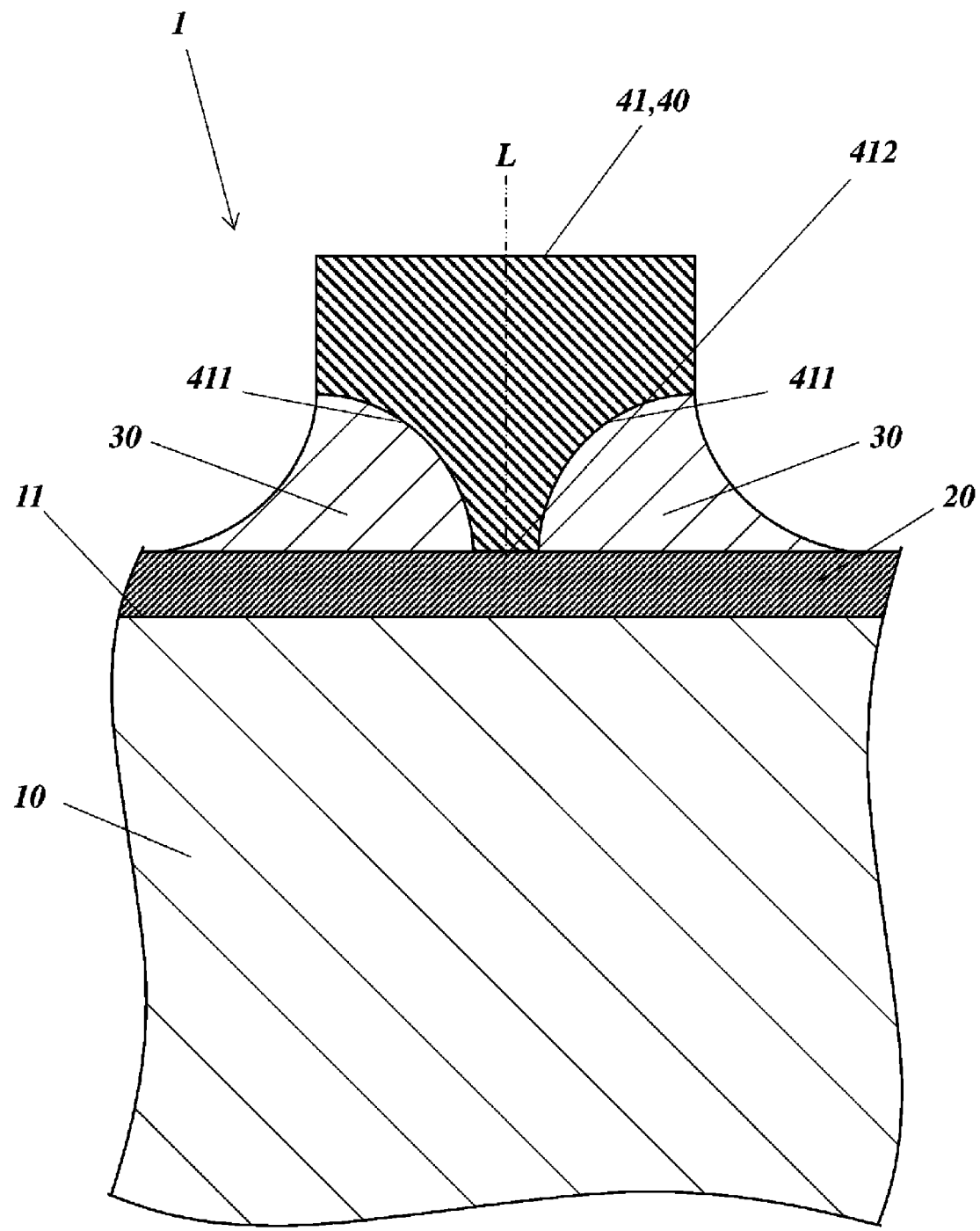
FIG. 9A is an enlarged cross-sectional view illustrating the wiring base of FIG. 7 that is cut along line IX-IX.
Figure 9B:
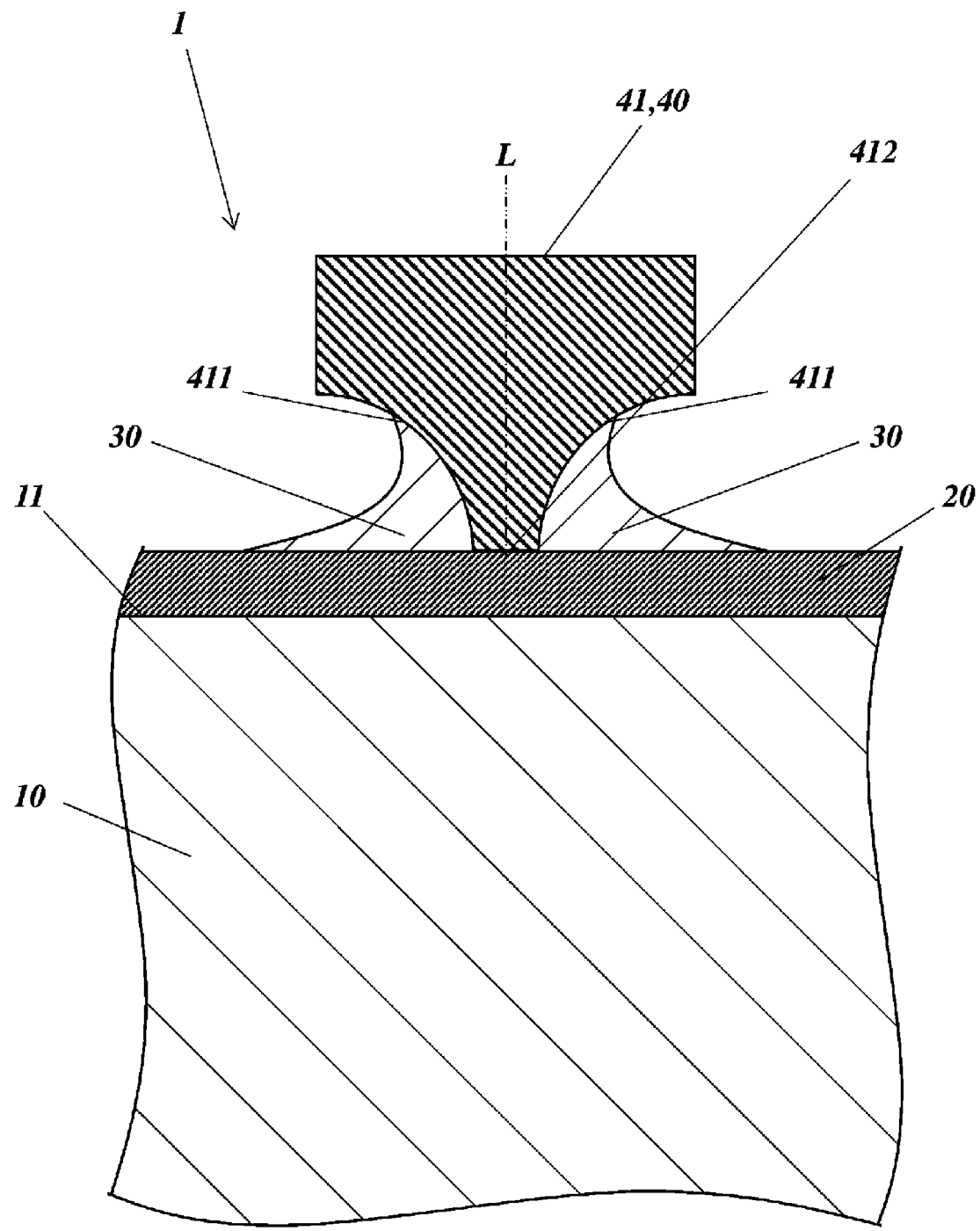
FIG. 9B is a cross-sectional view illustrating part of a wiring base according to an embodiment of the present disclosure.
Figure 10A:
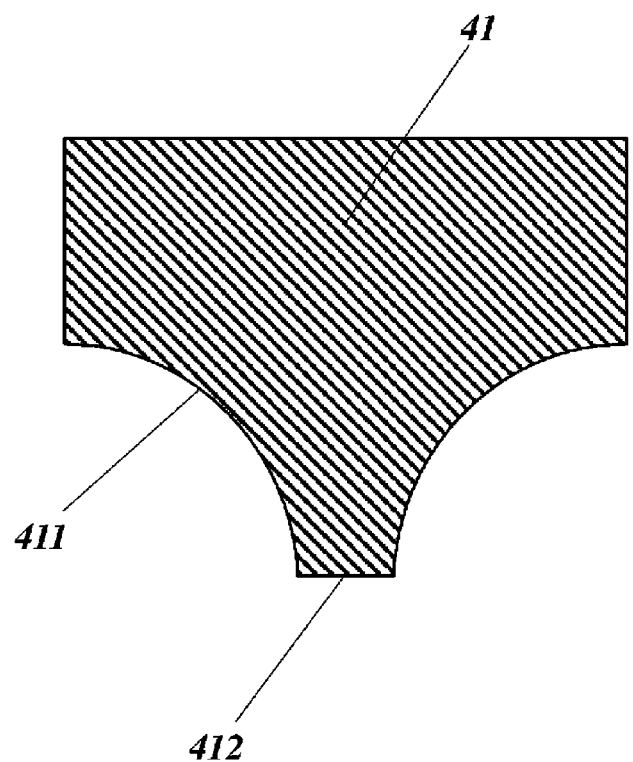
FIG. 10A is an example cross section of the lead terminal illustrated in FIGS. 6A to 6D, the example cross section being taken along line X-X.
Figure 10B:
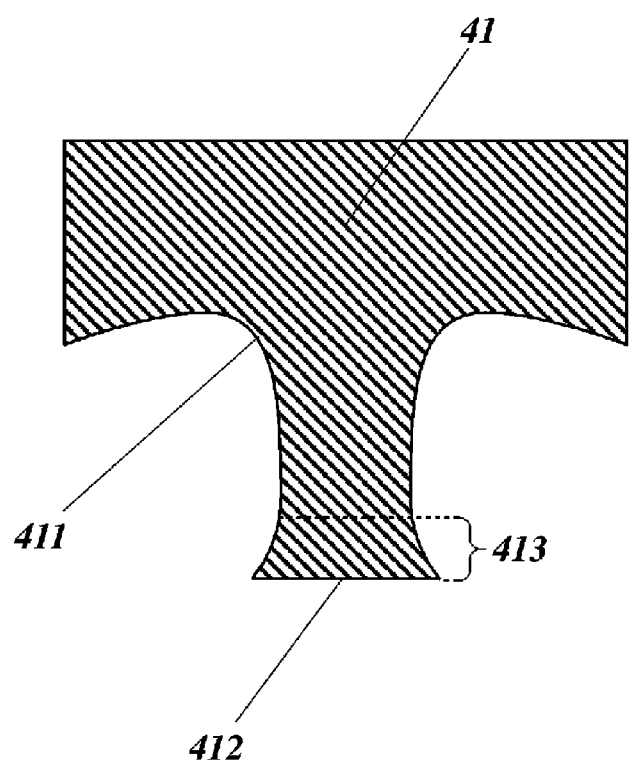
FIG. 10B FIG. 10B is an example cross section of the lead terminal illustrated in FIGS. 6A to 6D, the example cross section being taken along line X-X.
Figure 10C:
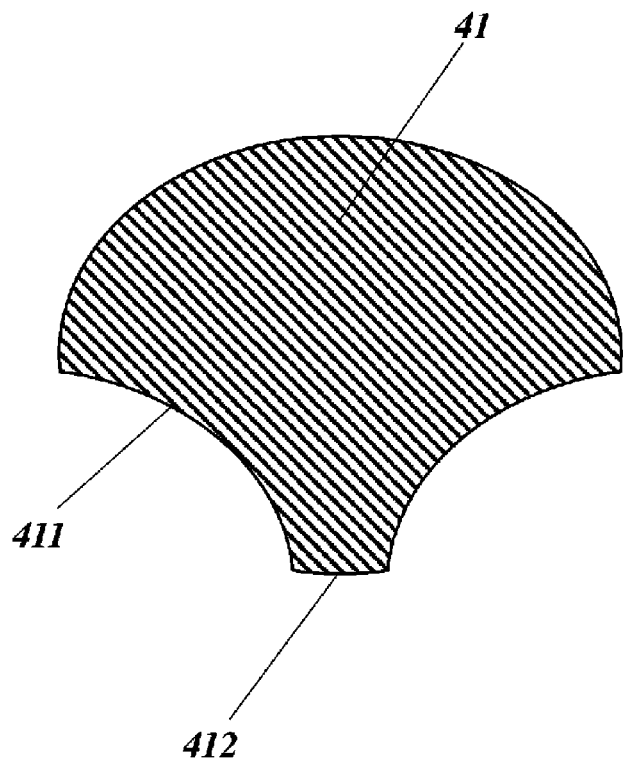
FIG. 10C is an example cross section of the lead terminal illustrated in FIGS. 6A to 6D, the example cross section being taken along line X-X.
Figure 10D:
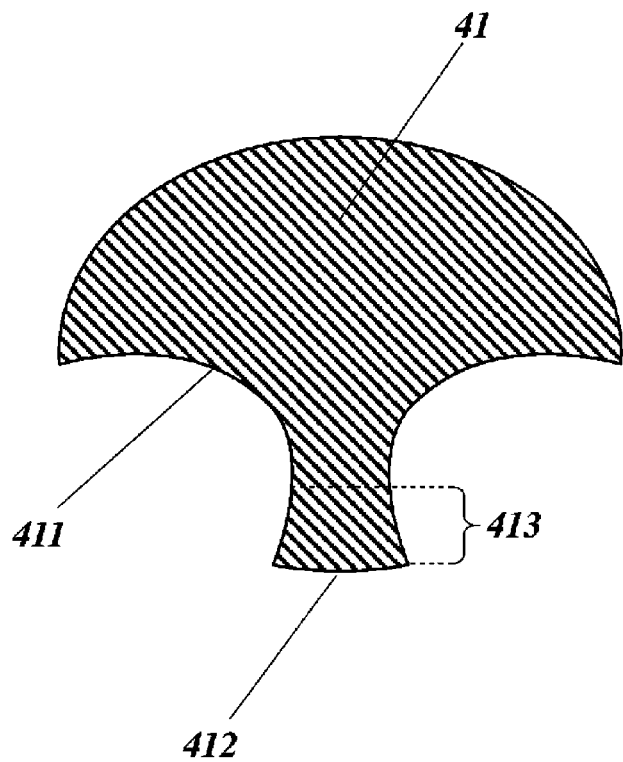
FIG. 10D FIG. 10D is an example cross section of the lead terminal illustrated in FIGS. 6A to 6D, the example cross section being taken along line X-X.
Figure 11A:
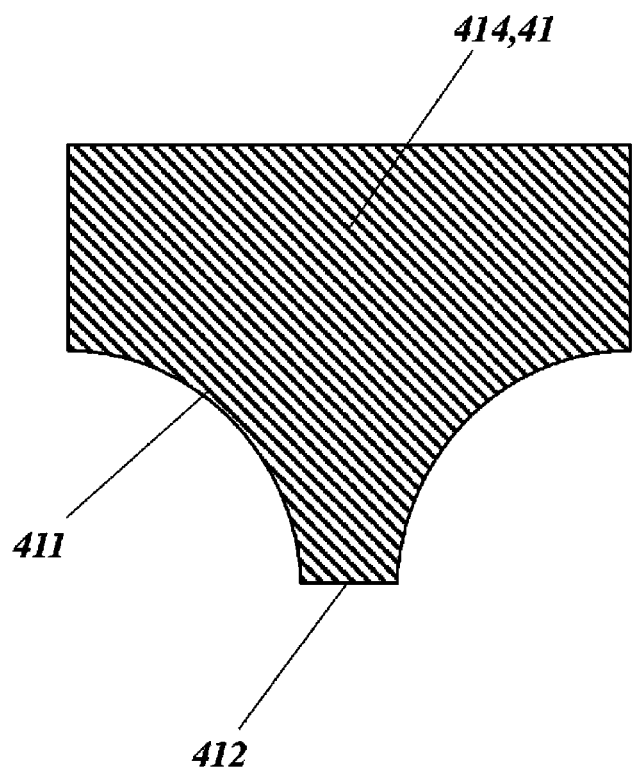
FIG. 11A is an example cross section of the lead terminal illustrated in FIGS. 6A to 6D, the example cross section being taken along line XI-XI.
Figure 11B:
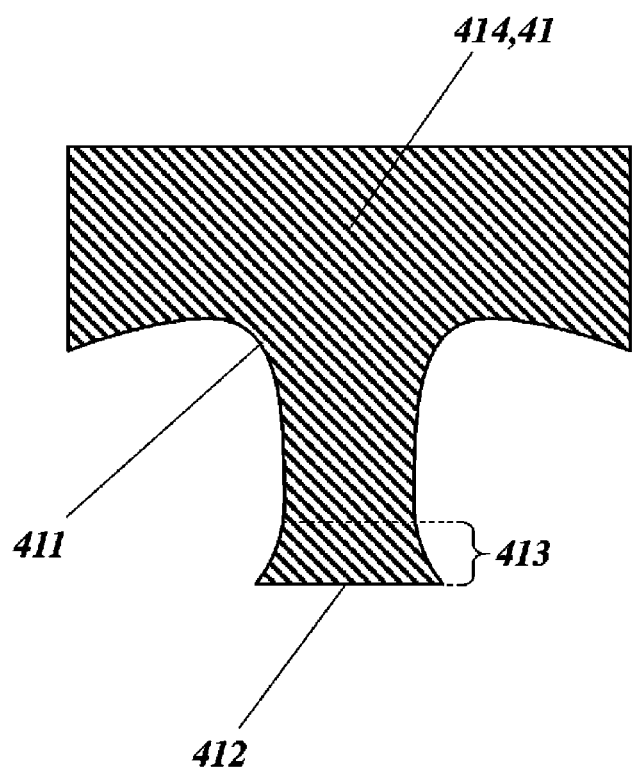
FIG. 11B is an example cross section of the lead terminal illustrated in FIGS. 6A to 6D, the example cross section being taken along line XI-XI.
Figure 11C:
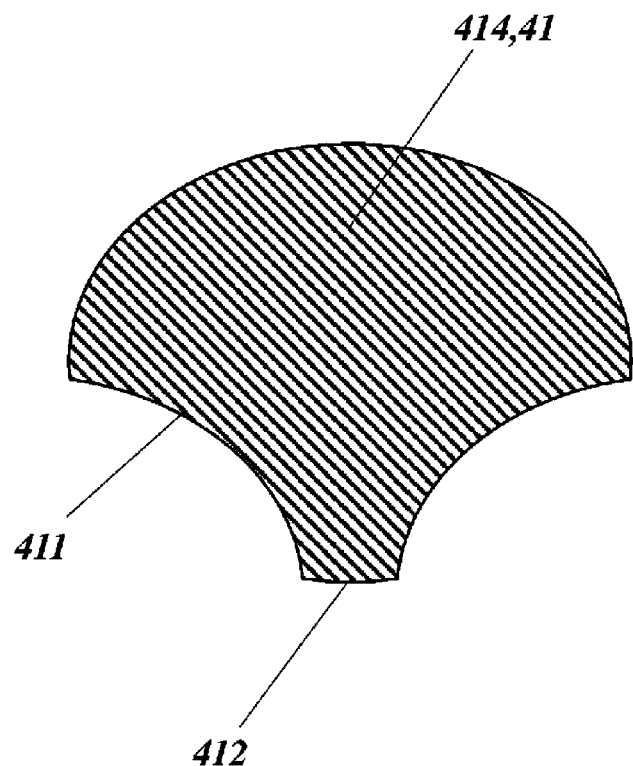
FIG. 11C is an example cross section of the lead terminal illustrated in FIGS. 6A to 6D, the example cross section being taken along line XI-XI.
Figure 11D:
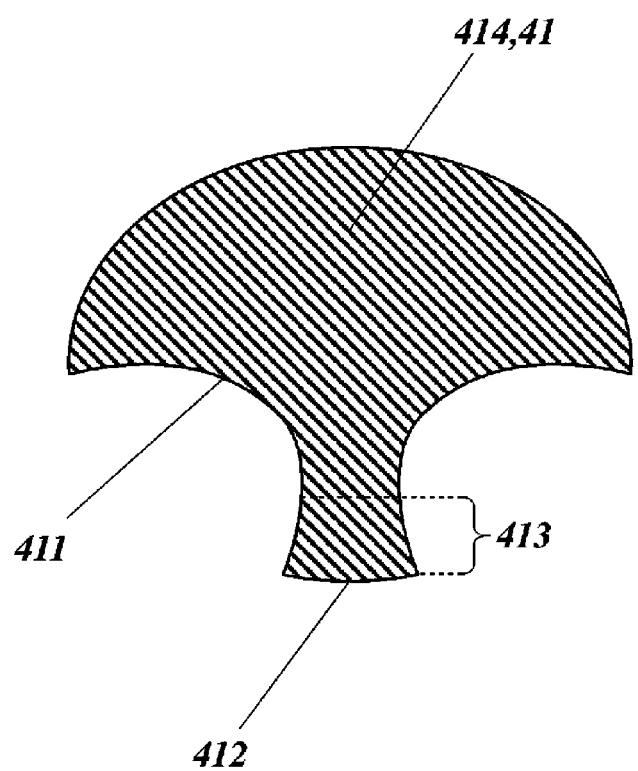
FIG. 11D is an example cross section of the lead terminal illustrated in FIGS. 6A to 6D, the example cross section being taken along line XI-XI.
Figure 12A:
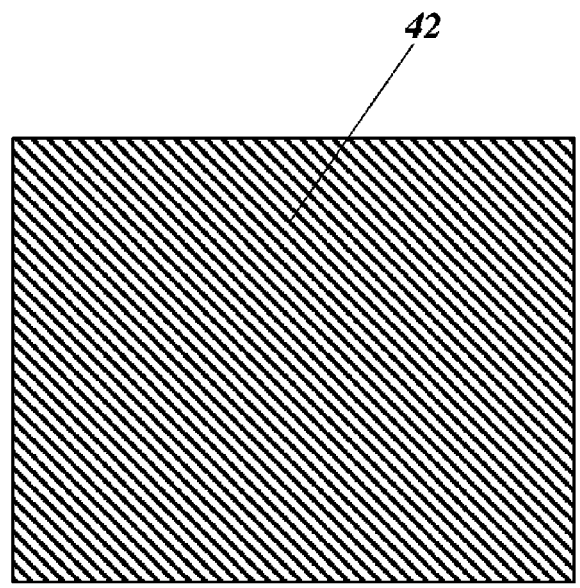
FIG. 12A is an example cross section of the lead terminal illustrated in FIGS. 6A to 6D, the example cross section being taken along line XII-XII.
Figure 12B:
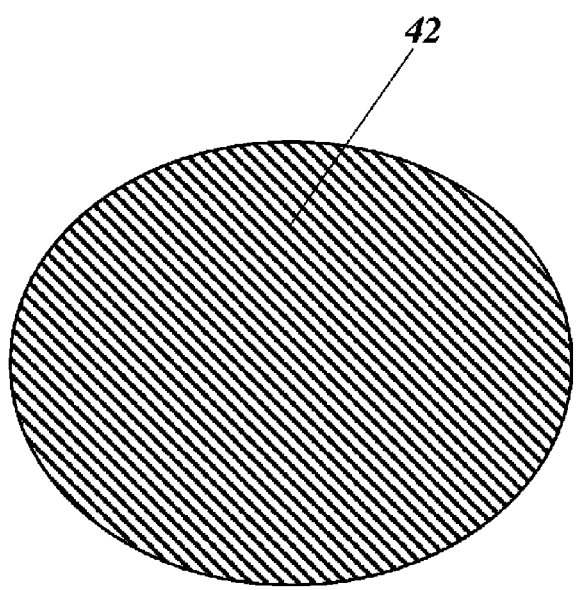
FIG. 12B is an example cross section of the lead terminal illustrated in FIGS. 6A to 6D, the example cross section being taken along line XII-XII.

FIGS. 6A to 6D are side views of the lead terminal 40. The metal layer 20 and the base 10 are indicated by dash-dot-dot lines in FIGS. 6A to 6D to facilitate better understanding of positional relationship between the lead terminal 40 and the metal layer 20 of the wiring base 1. FIG. 9A is an enlarged cross-sectional view illustrating the wiring base 1 of FIG. 7 that is cut along line IX-IX. FIG. 9B is an enlarged cross-sectional view illustrating the same section of the wiring base 1 as that of FIG. 9A. FIGS. 10A to 10D are example cross sections of the lead terminals illustrated in FIGS. 6A to 6D. These example cross sections are taken along line X-X. FIG. 11A to 11D are example cross sections of the lead terminals illustrated in FIGS. 6A to 6D. These example cross sections are taken along line XI-XI. FIGS. 12A and 12B are example cross sections of the lead terminal illustrated in FIGS. 6A to 6D. These example cross sections are taken along line XII-XII. FIG. 13 is enlarged cross-sectional views illustrating the same section of the wiring base 1 as that of FIG. 9A. In FIG. 13, a connection portion between the first lead terminal 401 and the signal conductor 21 is illustrated at the top, and a connection portion between the second lead terminal 402 and the grounding conductor 22 is illustrated at the bottom.

The lead terminals 40 are members to be used for electrical connection to an external circuit board or the like. The lead terminals 40 may be joined onto the signal conductors 21 or onto the grounding conductors 22 using the joining members 30 so as to extend in the first direction. Adjacent signal conductors 21 or grounding conductors 22 are disposed so as to have a gap therebetween, which can electrically insulate them from each other and reduce the electromagnetic coupling therebetween. Adjacent lead terminals 40 coupled to the signal conductors 21 or the grounding conductors 22 are electrically insulated from each other, while the electromagnetic coupling therebetween is reduced. In this state, the lead terminals 40 can be electrically connected to an external circuit board.

When each lead terminal is joined to the signal conductor or the grounding conductor using the joining member, a conventional lead terminal having inclined side surfaces does not sufficiently reduce the spread of the joining member. When the joining member spreads, the joining member produces heat stress and may cause cracks in the wiring substrate. It is expected to reduce the likelihood of cracks occurring.

As illustrated in FIGS. 6A to 6D, 7, and 8, each lead terminal 40 of the wiring base 1 according to an embodiment of the present disclosure has a first portion 41 to be in contact with the joining member 30 and a second portion 42 being continuous with the first portion 41. In addition, as illustrated in FIGS. 9A, 9B, 10A to 10D, and 11A to 11D, the first portion 41 has two concave surfaces 411. In the cross section of the first portion 41 orthogonal to the longitudinal direction of the lead terminal 40, the concave surfaces 411 are formed near the metal layer 20 so as to be disposed opposite to each other across the center in the transverse direction (width direction) of the lead terminal 40. In FIGS. 9A and 9B, the dash-dot-dot line indicates an imaginary center line L that passes through the widthwise center of the lead terminal 40. The center line L is also a vertical line perpendicular to the metal layer 20. In the above cross section of the lead terminal 40, each concave surface 411 is depressed toward the center of the lead terminal 40. The concave surface 411 is the inside surface of a groove that is formed such that a portion is cut out from the lead terminal 40 from a point in the thickness direction (i.e., from a point on the side surface) to the surface that opposes the metal layer 20.

The concave surfaces 411 of the lead terminal 40 increase the contact area (the area of joint surface) between the lead terminal 40 and the joining member 30, which increases the strength of the joint between the lead terminal 40 and the metal layer 20. Moreover, the joint surface between the lead terminal 40 and the joining member 30 is not flat but is curved in such a manner that the joining member 30 intrudes into the lead terminal 40, which improves the strength of the joint between the lead terminal 40 and the joining member 30.

In addition, the concave surface 411, which is a curved surface, facilitates fillet formation of the joining member 30 at the first portion 41. The fillet is formed readily into a thick shape that does not spread outward easily. Due to the joining member 30 not spreading easily over the metal layer 20, the thermal stress generated by the joining member 30 between the lead 41 and the metal layer 20 is reduced. Accordingly, the wiring base 1 having the concave surfaces 411 reduces the number of cracks. The concave surfaces 411 can be formed by etching, which will be described later.

If the lead terminal has a rectangular cross section instead of having the concave surfaces, the joint surface between the lead terminal and the joining member 30 is formed such that the joining member 30 reaches to a point on the side surface of the lead terminal. On the other hand, in the examples illustrated in FIGS. 9A and 9B, each concave surface 411 is shaped like a quarter circle. If the height of the concave surface 411, in other words, the radius of the arc, is the same height that the joining member reaches for the case of the lead terminal having a rectangular cross section, the area of the concave surface 411 is 1.5 times larger than the area of the joint surface for the case of the rectangular cross section. In other words, when the joining member 30 is in contact with the entire surface of each concave surface 411 as illustrated in FIG. 9A, the area of the joint surface for the case of the concave surface 411 is 1.5 times or more than the area of the joint surface for the case of the rectangular cross section. The joining member 30 is not necessarily in contact with the entire surface of the concave surface 411 as illustrated in FIG. 9B. Even in this case, if the joining member 30 is joined to the area up to two-thirds of the arc of the concave surface 411, the area of the joint surface is equal to or larger than the area of the joint surface for the case of the rectangular cross section. In addition, due to the joining member 30 joining to the curved surface as described above, the strength of joint between the lead terminal 40 and the joining member 30 increases, and the joining member 30 does not spread over the metal layer 20 easily.

The lead terminal 40 may extend in the first direction so that the longitudinal direction of the lead terminal 40 can align the first direction. The first portion 41 and the second portion 42 are continuous with each other in the longitudinal direction of the lead terminal 40. The size of the lead terminal 40 may be such that the longitudinal length ranges from 0.5 mm to 10 mm, the transverse length ranges from 0.05 mm to 2 mm, and the height ranges from 0.05 mm to 1 mm. The length of the first portion 41 can be substantially equal to the length of the signal conductor 21 and the first region 221 of the grounding conductor 22 to which the lead terminals 40 are joined. The concave surface 411 may have a constant radius of curvature as in the example of the FIG. 10A or may have a variable radius of curvature as in the example illustrated in FIG. 10B. In the case where the concave surface 411 has a constant radius of curvature and has an arcuate cross section, the radius of curvature can range, for example, from 0.02 mm to 0.6 mm. The maximum depth of the concave surface 411 from the surface of the lead terminal 40 that opposes the metal layer 20 can be 60% or less of the height of the lead terminal 40.

The two concave surfaces 411 of the lead terminal 40 may have the same radius of curvature. The radii of curvature of the two concave surfaces 411 may be different within the range of variation of accuracy in finishing. The two concave surfaces 411 may be positioned symmetrically with respect to the center line L that passes through the center in the transverse direction (width direction) of the lead terminal 40. When the two concave surfaces 411 are formed to have line symmetry, the fillets of the joining members 30 positioned oppositely to each other in the width direction of the lead terminal 40 readily form stable shapes. As a result, the strength of joint between the lead terminal 40 and the metal layer 20 becomes similar at both sides of the lead terminal 40 in the width direction, which reduces, for example, the likelihood of the joining member 30 starting to come off at a lower-strength joint. Accordingly, the wiring base 1 reduces the likelihood of malfunction caused, for example, by coming-off or pseudo-contact of the joining member 30. The positions of the two concave surfaces 411 may deviate from the line symmetry with respect to the vertical line within the range of variation of accuracy in finishing of the lead terminal 40.

In the cross section of the lead terminal 40 orthogonal to the longitudinal direction thereof, the shape of the second portion 42 may be the same as that of the first portion 41. In addition, as illustrated in FIGS. 12A and 12B, the shape of the second portion 42 may be different from that of the first portion 41 in the cross section of the lead terminal 40 orthogonal to the longitudinal direction thereof. More specifically, the second portion 42 may have a rectangular, circular, or elliptic cross section. In other words, the cross-sectional shape of the second portion 42 may be the same as that of the lead terminal 40 before the concave surfaces 411 are formed by etching or the like. Put it another way, the second portion 42 may have the same cross-sectional shape as that of the first portion 41 if the first portion 41 does not have the concave surfaces 411. For example, the first portion 41 may have the cross-sectional shape illustrated in FIG. 10A, and the second portion 42 may have the cross-sectional shape illustrated in FIG. 12A. Alternatively, for example, the first portion 41 may have the cross-sectional shape illustrated in FIG. 10C, and the second portion 42 may have the cross-sectional shape illustrated in FIG. 12B. In the case where the second portion 42 has a cross-sectional shape different from that of the first portion 41 as described above, the joining member 30 disposed at the concave surface 411 does not enter the second portion 42 easily. This enables the fillet of the joining member 30 to have a stable shape. Accordingly, the wiring base 1 configured as above reduces the likelihood of malfunction caused, for example, by coming-off or pseudo-contact of the joining member 30.

In addition, when the second portion 42 has a rectangular, circular, or elliptic cross section, the direction of the electric field of the lead terminal 40 does not spread easily. Accordingly, the wiring base 1 configured as above reduces the likelihood of transmission loss of high-frequency signals.

Figure 6A:
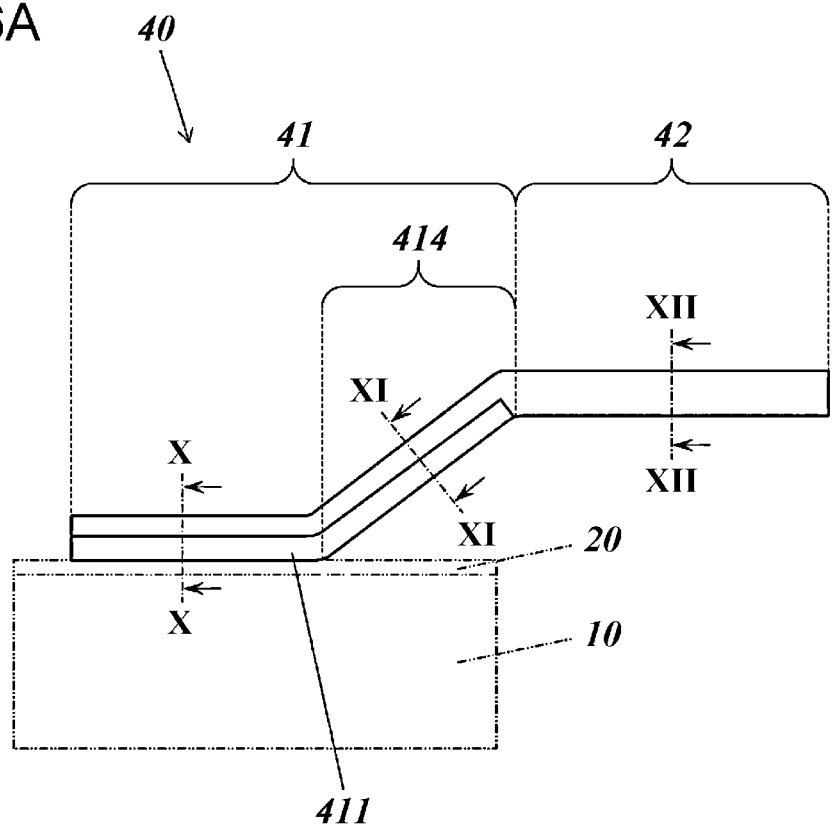
FIG. 6A is a side view illustrating a lead terminal of a wiring base according to an embodiment of the present disclosure.

As illustrated in FIGS. 6A and 7, the first portion 41 may include a portion A 414 that is positioned near the second portion 42 and inclines relative to the first surface 11. The portion A inclines such that the side near the second portion 42 is positioned away from the first surface 11 (the metal layer 20). The portion A 414 may incline at an angle of 1 to 45 degrees relative to the first surface 11.

The lead terminal 40 has the portion A 414. Accordingly, when the package 100 for storing semiconductor element is mounted on a printed circuit board or the like, stresses generated between the printed circuit board and the package 100 for storing semiconductor element can be alleviated by the portion A 414 of the lead terminal 40. When the first surface 11 is viewed in plane, the portion A 414 may be positioned so as to overlap the metal layer 20 at least partially, and the joining member 30 may also join the portion A 414 to the metal layer 20. The joining member 30 is thereby positioned also between the portion A 414 and the metal layer 20. As a result, the fillet of the joining member 30 can be formed readily between the portion A 414 of the first portion 41 and the metal layer 20, which further reduces the likelihood of the joining member 30 spreading over the metal layer 20. This reduces crack generation due to the thermal stress by the spreading joining member 30. The wiring base 1 configured as above reduces the number of cracks.

Figure 6B:
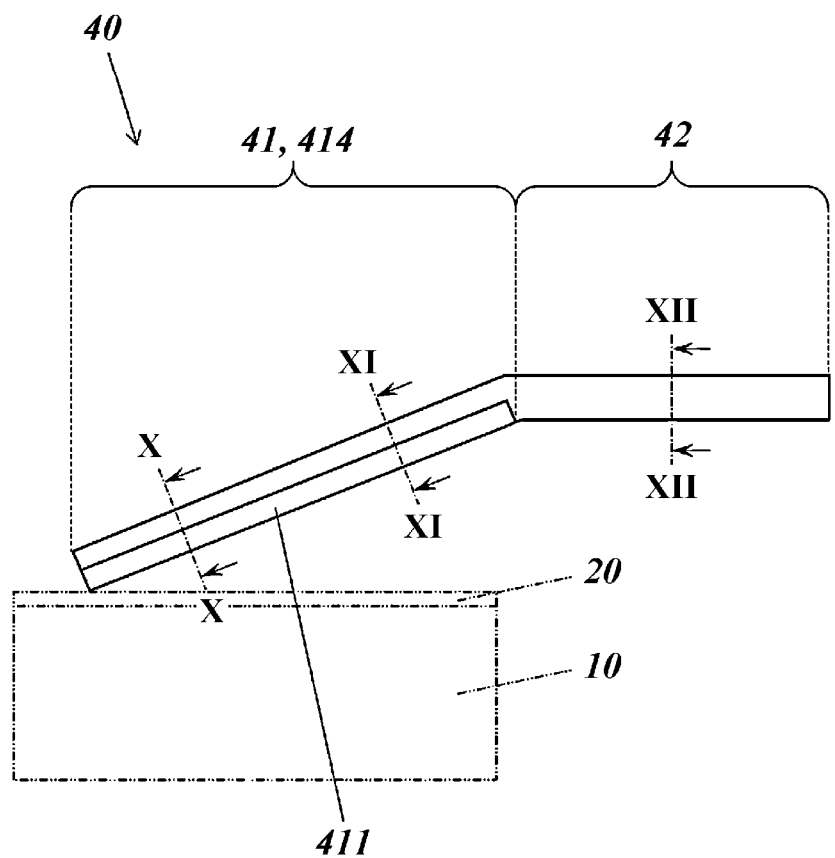
FIG. 6B is a side view illustrating a lead terminal of a wiring base according to an embodiment of the present disclosure.
Figure 6C:
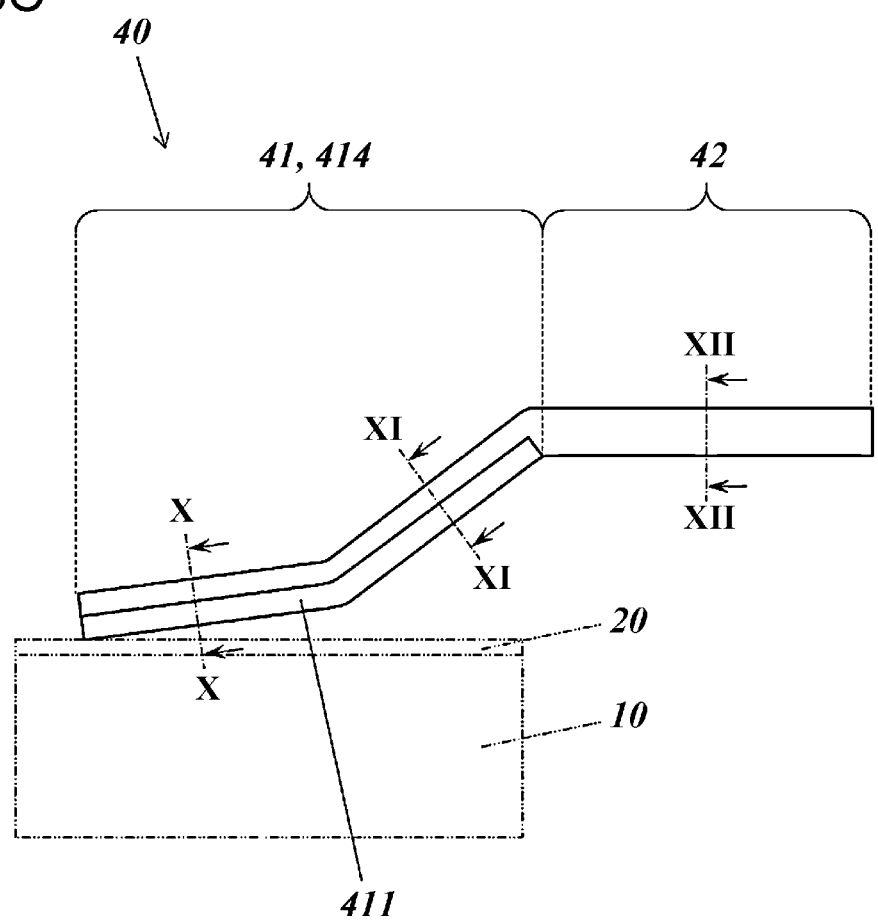
FIG. 6C is a side view illustrating a lead terminal of a wiring base according to an embodiment of the present disclosure.

The first portion 41 may be formed entirely of the portion A 414 as in the examples illustrated in FIGS. 6B and 6C. This reduces the area of direct contact between the lead terminal 40 and the metal layer 20 and thereby reduces the likelihood of the joining member 30 spreading. The inclination angle of the portion A 414 relative to the first surface may be constant in the longitudinal direction as illustrated in FIG. 6B or may change as illustrated in FIG. 6C. In the portion A of the lead terminal 40 of FIG. 6C, the side near the second portion 42 has a larger inclination angle relative to the first surface 11 compared with the opposite side. The side near the second portion 42, however, may have a smaller inclination angle.

In the cross-section of the lead terminal 40 orthogonal to the longitudinal direction thereof, the first portion 41 may have a first side 412 near the metal layer 20. When the first portion 41 has the first side 412, the lead terminal 40 can stand by itself on the metal layer 20. In other words, the lead terminal 40 can be placed stably on the metal layer 20. This make it easier to place the lead terminal 40 at a predetermined position and enable the joining member 30 to join the lead terminal 40 to the metal layer 20. The wiring base 1 configured as above reduces the likelihood of transmission loss of high-frequency signals that is caused by positional deviation of the lead terminal 40 relative to the wiring base 1. In the first portion 41 of the lead terminal 40, the first side 412 is the surface that opposes the metal layer 20. Put it another way, the first side 412 is the surface positioned between the two concave surfaces 411. If the first portion 41 does not have this surface (the first side 412) and, for example, the concave surfaces 411 are connected together so as to form a dihedral angle, the cross-sectional shape of the first portion 41 has a vertex (vertex angle) in the cross section of the lead terminal orthogonal to the longitudinal direction thereof. In this case, when the lead terminal 40 is placed on the metal layer 20, the lead terminal 40 may be toppled in the transverse direction and may be deviated in position.

The first side 412 may be formed so as to be continuous with the concave surfaces 411. The first side 412 may be straight or curved. More specifically, when the lead terminal 40 is shaped, for example, like a cuboid before the concave surfaces 411 are formed by etching or the like, the first side 412 may be straight. When the lead terminal 40 is shaped like a circular cylinder before the concave surfaces 411 are formed by etching or the like, the first side 412 may be curved. The length of the first side 412 may be 1 mm or less.

When the lead terminal 40 has a tapered shape in the longitudinal direction thereof before the concave surfaces 411 are formed by etching or the like, the length of the first side 412 may become shorter in the longitudinal direction.

As in the examples illustrated in FIGS. 10B, 10D, 11B, and 11D, the first portion 41 may have a wide portion 413 that is widened toward the first side 412. The wiring base 1 having the wide portion 413 can increase the strength of the lead terminal 40 and thereby reduce the likelihood of malfunction caused, for example, by breakage of the lead terminal 40. The lead terminal 40 having the wide portion 413 can reduce the likelihood of the lead terminal 40 being deformed excessively when the lead terminal 40 is bent, which can reduce variation in the shape of the lead terminal 40 in the wiring base 1. The wiring base 1 having the wide portions 413 reduces the likelihood of transmission loss of high-frequency signals that is caused by the variation in the shape. The wide portion 413 is a portion positioned between the two concave surfaces 411, and the width of the portion becomes larger gradually toward the first side 412 from a position inside the lead terminal 40. In other words, the wide portion 413 is shaped such that the distance between the two concave surfaces 411 becomes larger gradually toward the first side 412.

As in the example illustrated in FIG. 13, a width W1 of the first side 412 of the first lead terminal 401 to be in contact with the signal conductor 21 may be smaller than a width W2 of the first side 412 of the second lead terminal 402 to be in contact with the grounding conductor 22. Accordingly, even when the width of the signal conductor 21 is reduced to lower the effective dielectric constant, the joining member 30 does not flow easily to the recess 12 or to the recess 13. The wiring base 1 configured as above reduces the number of cracks. Note that in the present specification, the width of the first side 412 of the first lead terminal 401 is denoted by W1, and the width of the first side 412 of the second lead terminal 402 is denoted by W2. The difference in width between W1 and W2 may be set in accordance with the difference in width between the signal conductor 21 and the grounding conductor 22.

The first portion 41 need not have the first side 412. In other words, the first portion 41 may have a vertex between the two concave surfaces 411 in the cross-section of the lead terminal 40 orthogonal to the longitudinal direction thereof. This can increase the amount of the joining member 30 at the first portion 41 and thereby increase the joint strength. Moreover, the joining member 30 can readily enter the concave surfaces 411 and thereby form a stable shape of the fillet of the joining member 30. The wiring base 1 of which the first portion 41 has the vertex reduces the likelihood of malfunction caused, for example, by coming-off or pseudo-contact of the joining member 30. The vertex may be positioned on the vertical line. Note that the position of the vertex may deviate rightward or leftward within the range of variation of accuracy in finishing of the lead terminal 40.

Figure 6D:
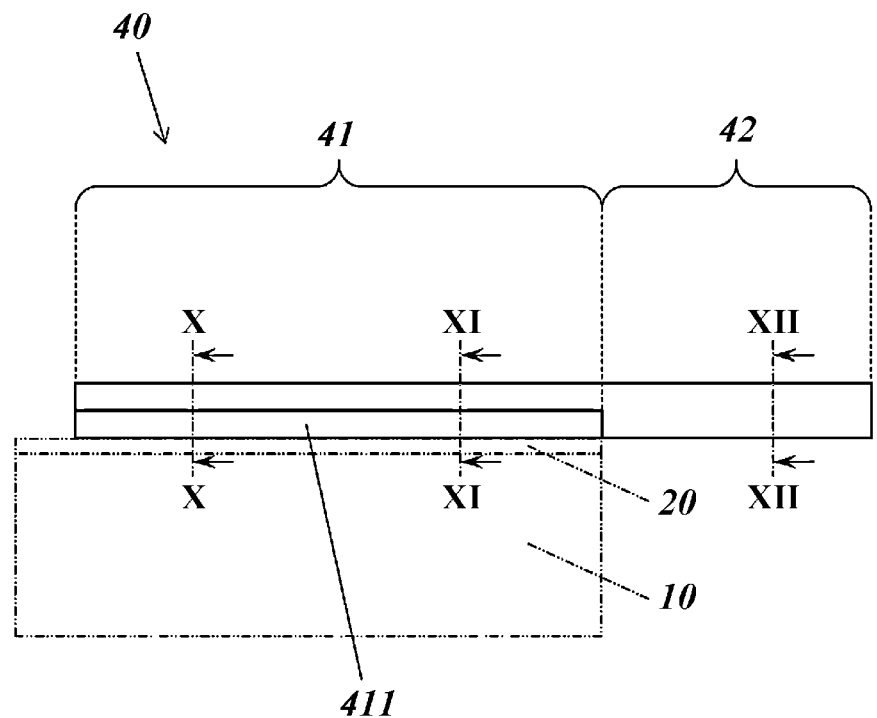
FIG. 6D is a side view illustrating a lead terminal of a wiring base according to an embodiment of the present disclosure.

As illustrated in FIG. 6D, the lead terminal 40 may have a linear shape (columnar shape) that longitudinally extends straight in the first direction. When the lead terminal 40 has the linear shape, the wiring base 1 can improve the high-frequency characteristics because the length of the lead terminal 40 can be reduced. Moreover, in this case, the lead terminal 40 has a smaller height, which leads to a reduction in the height of the wiring base 1.

An internal grounding conductor may be present inside the base 10 or between insulating layers. The internal grounding conductor may be positioned parallel to the metal layer 20. The internal grounding conductor has a ground potential and may be electrically connected to the grounding conductor 22. Multiple internal grounding conductors may be provided and electrically connected to each other using via-hole conductors. The wiring base 1 configured as above provides a wider region for grounding and thereby improves the high-frequency characteristics.

For example, the via-hole conductors can be made of a metal, such as tungsten, molybdenum, and manganese. The internal grounding conductor may be a metallized layer formed on an insulating layer. The metallized layer is made of a metal, such as tungsten, molybdenum, and manganese. The metallized layer positioned on the surface of the base 10 may be plated with nickel or gold.

The length of the via-hole conductor may range from 0.1 mm to 0.5 mm. The via-hole conductor having such a length can prevent its resistance from increasing. The wiring base 1 configured as above reduces the likelihood of transmission loss of high-frequency signals.

As in the examples illustrated in FIGS. 2 and 3, a metal layer 20 may be present also on the surface of the base 10 that is opposite to the first surface 11. This metal layer 20 may be formed into multiple connection conductors 23 that are to be electrically connected to a semiconductor element 70. The connection conductors 23 may be electrically connected to the signal conductors 21 or to the grounding conductor 22 via wiring conductors disposed inside the base 10. The connection conductors 23 may be formed by a metallized layer similar to those for signal conductors 21 and others. The surface of the metallized layer may be plated with nickel or gold.

Method of Manufacturing Wiring Base 1

The following describes an example method of manufacturing the wiring base 1. The wiring base 1 includes the base 10, the metal layers 20, the joining members 30, and the lead terminals 40. First, an example method of manufacturing the base 10 is described. In the case where the base 10 has multiple insulating layers and the insulating layers are formed of aluminum oxide-based sintered bodies, the base 10 is manufactured as follows. For example, powders of aluminum oxide and silicon oxide are provided as raw materials. An appropriate organic binder and a solvent are added to the raw materials and mixed to prepare a slurry. Next, the slurry is formed into multiple ceramic green sheets using, for example, the doctor-blade method. Here, recesses 12 and 13 and a hollow 14 may be cut from a portion of each green sheet.

Next, an example method of manufacturing the metal layer 20 is described. The metal layers 20, such as the signal conductors 21, the grounding conductors 22, the internal grounding conductors, and the connection conductors 23, can be formed as metallized layers of a refractory metal, such as tungsten, molybdenum, and manganese. In this case, the metal layers 20 can be formed as follows. A metal paste is first prepared by thoroughly mixing a refractory metal powder with an organic solvent and binder. The metal paste is subsequently applied onto the upper or lower surface of the ceramic green sheet at appropriate positions using screen printing or the like. The ceramic green sheet will later be an insulating layer. Multiple ceramic green sheets with the metal paste thereon are laminated and pressed together and subsequently co-fired. Thus, the signal conductors 21, the grounding conductor 22, the internal grounding conductors, and the connection conductors 23 are formed as the metallized layers on the first surface 11 and the other surface of the base 10 and also on the internal layers. Here, the metal paste can be applied, and accordingly the metallized layers can be formed, also on the inside surfaces and the bottom surfaces of the recesses 12 and 13 and the hollow 14. The surfaces of the conductors may be plated with nickel or gold.

The via-hole conductors can be formed by forming holes through the ceramic green sheets that later serve as the insulating layers and by filling the metal paste for forming other conductors into the holes. Subsequently, the ceramic green sheets are laminated, pressed together, and co-fired. For example, the through holes can be formed by mechanical punching using metallic pins or by laser processing. When the through holes are filled with the metal paste, the vacuum suction can be used to fill the metal paste efficiently.

Next, an example method of forming the lead terminal 40 is described. The lead terminal 40 can be shaped as desired by etching or die pressing. In the etching process, the lead terminal is masked to form corrosion-resistant regions, and subsequently the other regions are etched by the etchant. Part of the lead terminal 40 is etched to have a desired shape and form the concave surfaces 411, the first side 412, and the wide portion 413, etc. In the case of the first portion 41 having the portion A 414, the lead terminal 40 is bent after the etching process. Note that the radius of curvature of the concave surface 411 can be set by adjusting the duration of etching and the amount of etchant in the etching. In the case of the die pressing, the lead terminal 40 is punched out and processed using dies. Subsequently, the lead terminal 40 is processed using a laser beam to have a desired shape and form the concave surfaces 411, the first side 412, and the wide portion 413, etc. In the case of the die processing, the laser processing may be performed before bending. The concave surfaces 411 and others can be formed by die pressing.

The wiring base 1 is produced by forming the metal layers 20 on the base 10 and by joining the lead terminals 40 to the metal layers 20 (the signal conductors 21 and the grounding conductor 22) using the joining members 30. For example, the joining member 30 is made of solder or a brazing metal. A paste or foil of the solder or the brazing metal is placed between the metal layers 20 and the lead terminals 40 and is heated to a predetermined temperature, which enables the joining members 30 to join the lead terminals 40 to the metal layers 20.

Structure of Package 100 for Storing Semiconductor Element

As illustrated in FIGS. 1 to 3, the package 100 for storing semiconductor element includes the wiring base 1, a base plate 50, and a frame 60.

The base plate 50 has a mounting surface 51. The base plate 50 may have a rectangular shape as viewed in plane. In the case of the base plate 50 being rectangular, the size of the base plate 50 may range from 5 mm by 10 mm to 50 mm by 50 mm as viewed in plane. The height (thickness) of the base plate 50 may range from 0.3 mm to 20 mm. For example, the mounting surface 51 may have the same shape as that of the base plate 50, in other words, the rectangular shape as viewed in plane. In the case of the mounting surface 51 being rectangular, the size of the mounting surface 51 may range from 5 mm by 10 mm to 50 mm by 50 mm as viewed in plane. The sizes of the base plate 50 and the mounting surface 51 can be set appropriately.

For example, the base plate 50 can be made of a metal, such as iron, copper, nickel, chromium, cobalt, molybdenum, or tungsten, or an alloy thereof, such as a copper-tungsten alloy, a copper-molybdenum alloy, or an iron-nickel-cobalt alloy. An ingot of such a metallic material is subjected to metal processing, such as metal rolling or punching, to prepare metal members for forming base plates 50.

The frame 60 is disposed so as to surround the mounting surface 51. When the mounting surface 51 is viewed in plane, the frame 60 may be shaped, for example, like a rectangle or the letter U, and the size of the frame 60 may be in the range of 5 mm by 10 mm to 50 mm by 50 mm. The height may be in the range of 2 mm to 15 mm. The thickness of the frame 60 (the width between an inner peripheral surface and an outer peripheral surface as viewed in plane) may range from 0.5 mm to 2 mm. The size of the frame 60 can be set appropriately.

For example, the frame 60 can be made of a metal, such as iron, copper, nickel, chromium, cobalt, molybdenum, or tungsten, or an alloy thereof, such as a copper-tungsten alloy, a copper-molybdenum alloy, or an iron-nickel-cobalt alloy. An ingot of such a metallic material is subjected to metal processing, such as metal rolling or punching, to prepare metal members for forming the frames 60.

The wiring base 1 engages an engagement portion 61 that is formed in side walls of the frame 60. The engagement portion 61 passes through the frame 60 in a direction parallel to the mounting surface 51 so as to connect the inside and the outside of the frame 60. In the case of the frame 60 being rectangular as the mounting surface 51 is viewed in plane, the engagement portion 61 may be formed so as to cut a portion out of the frame 60 in the height direction. Here, "a portion in the height direction" means a portion of the frame 60 having a length, for example, of 0.5 mm to 10 mm in the height direction. Here, the shape of the engagement portion 61 is like the letter U as viewed in plane. If the frame 60 is shaped like the letter U as the mounting surface 51 is viewed in plan, the portion of the frame 60 that does not have a member for forming the frame may serve as the engagement portion 61. Put it another way, the engagement portion 61 may be formed such that the entire height-wise portion of one side member of the frame is cut away from the rest of the frame 60 that has been rectangular as the mounting surface 51 is viewed in plane.

Insulated terminals made of an aluminum oxide-based sintered body are inserted and engaged in the engagement portion 61. The insulated terminals electrically connect the outside and the inside of the above-described wiring base 1 and of the package 100 for storing semiconductor element. In other words, the wiring base serves as the electric terminal for input and output in the package 100 for storing semiconductor element.

As in the examples illustrated in FIGS. 1 to 3 and FIG. 14, the wiring base 1 may be shaped like the letter U as viewed in plane. The wiring base 1 and the engagement portion 61 may overlap each other as viewed through in plane. The peripheral portion of the wiring base 1 may protrude out from three sides of the frame 60. The wiring base 1 and the frame 60 may be joined to each other using a joining member, such as a brazing metal. The base plate 50 may be joined to the frame 60 and to the wiring base 1 using a joining member, such as a brazing metal. One opening of the frame 60 may be closed by the wiring base 1 and the base plate 50, thereby forming the box-like package 100 for storing semiconductor element that can store the semiconductor element 70 therein.

Structure of Semiconductor Device 1000

Figure 14:
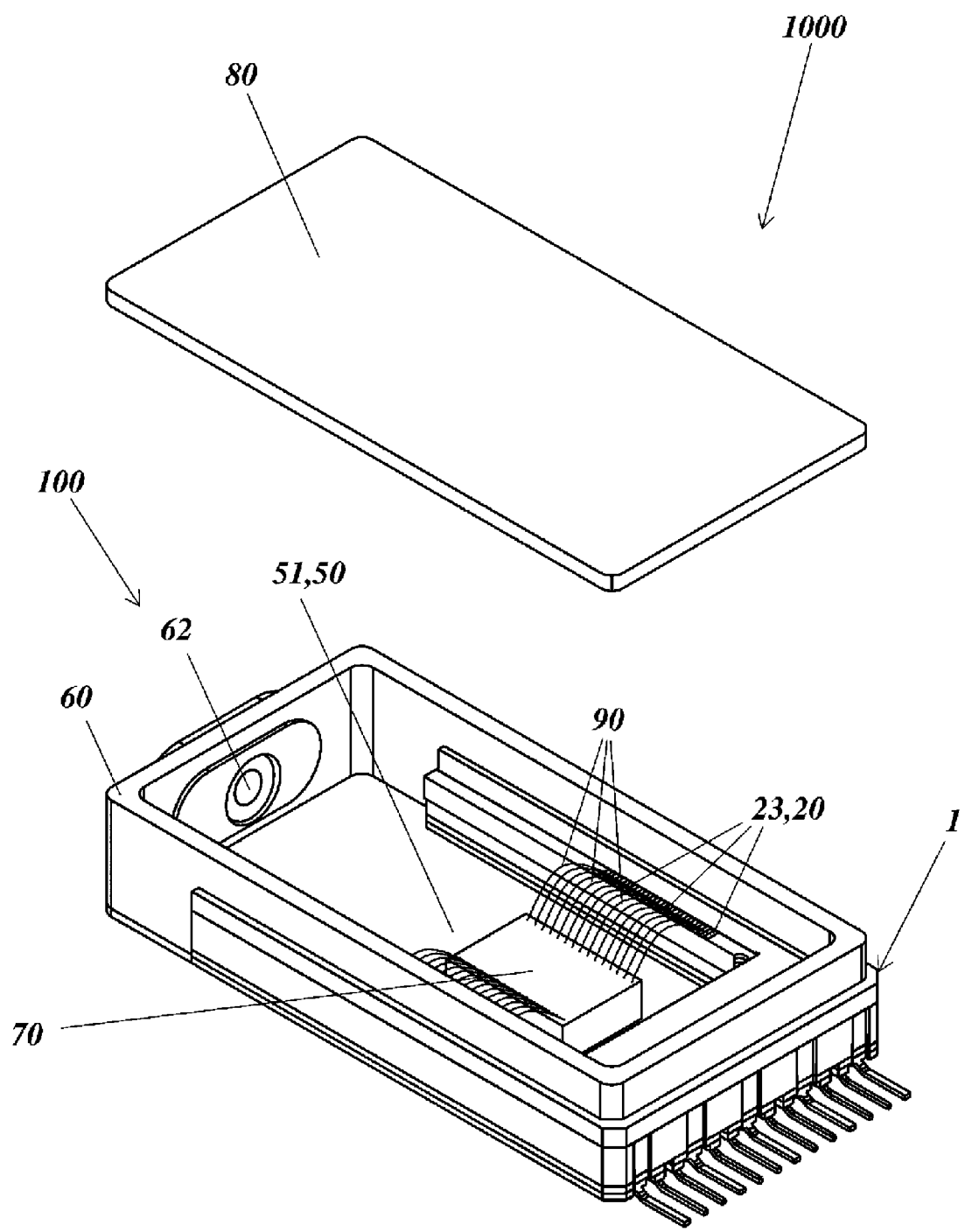
FIG. 14 is a perspective view illustrating a semiconductor device according to an embodiment of the present disclosure.

As illustrated in FIG. 14, the semiconductor device 1000 includes the package 100 for storing semiconductor element and the semiconductor element 70. The semiconductor element 70 is positioned at the mounting surface 51 of the base plate 50 and electrically connected to the signal conductors 21 and the grounding conductor 22. The semiconductor element 70 may be fixed to the mounting surface 51 using a joining member, such as solder or a brazing metal. The semiconductor element 70 may be electrically connected to the signal conductors 21 and the grounding conductor 22 by connecting the semiconductor element 70 (i.e., the electrodes thereof) to the connection conductors 23 of the wiring base 1 using connection members 90, such as bonding wires.

For example, the semiconductor element 70 may be a laser diode (LD). The semiconductor element 70 may be a photodiode (PD) or the like. In the case of the semiconductor element 70 being the LD, a through hole 62 may be formed in a side wall of the frame 60, and an optical fiber cable may be attached thereto.

A lid 80 may be disposed at the top end of the frame 60 so as to cover the package 100 for storing semiconductor element. The lid 80 may be joined to the frame 60 using a joining member, such as a brazing metal, or may be welded to the frame 60, to seal the package 100 for storing semiconductor element. The lid 80 has a rectangular shape as viewed in plane, and the size of the lid 80 ranges from 5 mm by 10 mm to 50 mm by 50 mm. The thickness ranges from 0.5 mm to 2 mm. For example, the lid 80 can be made of a metal, such as iron, copper, nickel, chromium, cobalt, molybdenum, or tungsten, or an alloy thereof, such as a copper-tungsten alloy, a copper-molybdenum alloy, or an iron-nickel-cobalt alloy.

The semiconductor device 1000 can be manufactured by mounting the semiconductor element 70 onto the mounting surface 51 of the package 100 for storing semiconductor element and by electrically connecting the semiconductor element 70 to the wiring base 1 using, for example, bonding wires.

The present disclosure is not limited to the above-described embodiments but may be altered in various ways without departing from the gist of the present disclosure. All the alterations and modifications that fall within the scope of the claims are included in the present disclosure.

REFERENCE SIGNS LIST 1 wiring base
10 base
11 first surface
12 recess
13 recess
14 hollow
20 metal layer
21 signal conductor
22 grounding conductor
221 first region
222 second region
23 connection conductor
30 joining member
40 lead terminal
401 first lead terminal
402 second lead terminal
41 first portion
411 concave surface
412 first side
413 wide portion
414 portion A
42 second portion
50 base plate
51 mounting surface
60 frame
61 engagement portion
62 through hole
70 semiconductor element
80 lid
100 package for storing semiconductor element
1000 semiconductor device

The invention claimed is:

1. A wiring base, comprising:
a base having a first surface;
at least one metal layer positioned on the first surface;
at least one lead terminal positioned on the metal layer; and
a joining member that is positioned on the metal layer and joins the lead terminal to the metal layer, wherein
the lead terminal has a first portion to be in contact with the joining member and a second portion being continuous with the first portion, and
in a cross section of the lead terminal orthogonal to a longitudinal direction of the lead terminal, the first portion has two concave surfaces that are formed near the metal layer so as to be disposed opposite to each other across a center in a transverse direction of the lead terminal.

2. The wiring base according to claim 1, wherein
in the cross section of the lead terminal, a shape of the first portion is different from that of the second portion.

3. The wiring base according to claim 1, wherein
the first portion includes a portion A (414) that is positioned near the second portion and inclines relative to the first surface,
when the first surface is viewed in plane, the portion A (414) is positioned so as to overlap the metal layer at least partially, and
the joining member joins the portion A (414) to the metal layer.

4. The wiring base according to claim 1, wherein
in the cross-section of the lead terminal orthogonal to the longitudinal direction of the lead terminal, the first portion also has a first side near the metal layer.

5. The wiring base according to claim 4, wherein
the first portion also has a wide portion formed from the first side.

6. The wiring base according to claim 4, wherein
the at least one metal layer comprises a signal conductor and a grounding conductor,
the at least one lead terminal comprises a first lead terminal and a second lead terminal,
the first lead terminal is positioned on the signal conductor,
the second lead terminal is positioned on the grounding conductor, and
a width W1 of the first side of the first lead terminal is smaller than a width W2 of the first side of the second lead terminal.

7. A package for storing semiconductor element, comprising:
the wiring base according to claim 1;
a base plate having a mounting surface; and
a frame positioned so as to surround the mounting surface, wherein
the frame has an engagement portion formed through the frame in a direction parallel to the mounting surface so as to connect an inside and an outside of the frame, and
the wiring base is disposed so as to engage the engagement portion.

8. A semiconductor device, comprising:
the package for storing semiconductor element according to claim 7, and
a semiconductor element positioned at the mounting surface and electrically connected to the signal conductor and the grounding conductor.

* * * * *